(12) United States Patent
Aoshima et al.

(10) Patent No.: US 7,235,978 B2
(45) Date of Patent: Jun. 26, 2007

(54) DEVICE FOR MEASURING IMPEDANCE OF ELECTRONIC COMPONENT

(75) Inventors: Youichi Aoshima, Osaka (JP); Kazuo Kawahito, Osaka (JP); Junichi Kurita, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/517,068

(22) Filed: Sep. 7, 2006

(65) Prior Publication Data

US 2007/0052431 A1    Mar. 8, 2007

(30) Foreign Application Priority Data

Sep. 7, 2005    (JP) ............................. 2005-258791

(51) Int. Cl.
*G01R 31/08* (2006.01)
*G01R 27/08* (2006.01)
*G01R 31/02* (2006.01)

(52) U.S. Cl. ..................... 324/526; 324/715; 324/754

(58) Field of Classification Search ................ 324/526, 324/525, 512, 500, 76.11, 158.1, 71.1, 72.5, 324/690, 696, 715, 724, 754, 757, 758, 755, 324/765; 73/335.03; 257/690, 700; 439/91

See application file for complete search history.

(56) References Cited

U.S. PATENT DOCUMENTS 5,166,605 A * 11/1992 Daum et al. ................ 324/754

7,019,543 B2 * 3/2006 Quon ........................ 324/713
7,030,622 B2 * 4/2006 Chen et al. ................ 324/538
7,071,722 B2 * 7/2006 Yamada et al. ............ 324/765
7,156,669 B2 * 1/2007 Asai et al. .................... 439/91
2006/0220663 A1 * 10/2006 Oikawa ..................... 324/718

FOREIGN PATENT DOCUMENTS

JP          08-110366         4/1996
JP          09-035789         2/1997

* cited by examiner

*Primary Examiner*—Andrew H. Hirshfeld
*Assistant Examiner*—Hoai-An D. Nguyen
(74) *Attorney, Agent, or Firm*—RatnerPrestia

(57) ABSTRACT

A device measures an impedance of an electronic component with using an impedance measuring apparatus. The impedance measuring device includes first and second probes to be connected to measuring terminals of the impedance measuring apparatus, an anisotropic conductive sheet, and a pressing member for pressing the electronic component toward the first and second probes. The first probe has a first contact surface. The second probe has a second contact surface flush with the first contact surface. The anisotropic conductive sheet has a first surface contacting the first and second contact surface, and a second surface opposite to the first surface. The pressing member causes first and second external terminals of the electronic component to contact the anisotropic conductive sheet. The conductive sheet includes an insulating elastic sheet and plural conductive wires penetrating the elastic sheet to expose from the first surface and the second surface. The conductive wires electrically connect the first and second external terminals to the first and second contact surfaces, respectively.

7 Claims, 5 Drawing Sheets

DEVICE FOR MEASURING IMPEDANCE OF ELECTRONIC COMPONENT

FIELD OF THE INVENTION

The present invention relates to a device for measuring an impedance, such as a low impedance, of an electronic component.

BACKGROUND OF THE INVENTION

Surface-mounted capacitors having a low equivalent series resistance (ESR) and a low equivalent series inductance (ESL) have been recently used in power supplies for central processing units (CPUs) used in computers in order to prevent voltage drop due to load fluctuation.

A surface-mounted capacitor has plural external terminals provided on a lower surface thereof. These external terminals are close to each other, hence providing a low ESL.

In order to perform circuit simulation for designing a precise and stable power supply, it is necessary to measure the ESR and ESL accurately. Accordingly, a device for measuring an impedance of the surface-mounted capacitor having the low ESR and the low ESL precisely is required.

A conventional device for measuring an impedance disclosed in Japanese Patent Laid-Open Patent Publication No. 8-110366 includes an elastic anisotropic conductive sheet. This sheet is provided between an external terminal of a surface-mounted component and a measuring probe in order to connect the external terminal of the surface-mounted component to the measuring probe.

In this conventional device, a pressure applied to the electronic component is uniformly applied to the anisotropic conductive sheet. This sheet cannot connect the external terminal stably to the measuring probe according to various surface flatness and surface configurations of the external terminal and the measuring probe, accordingly preventing the low ESR and the low ESL of the surface-mounted component from being measured accurately.

SUMMARY OF THE INVENTION

A device measures an impedance of an electronic component with using an impedance measuring apparatus. The electronic component includes first and second external terminals exposing on a surface. The impedance measuring device includes first and second probes to be connected to measuring terminals of the impedance measuring apparatus, an anisotropic conductive sheet, and a pressing member for pressing the electronic component toward the first and second probes. The first probe has a first contact surface. The second probe has a second contact surface flush with the first contact surface. The anisotropic conductive sheet has a first surface contacting the first and second contact surface, and a second surface opposite to the first surface. The pressing member causes the first and second external terminals of the electronic component to contact the anisotropic conductive sheet. The conductive sheet includes an insulating elastic sheet and plural conductive wires penetrating the elastic sheet to expose from the first surface and the second surface. The conductive wires electrically connect the first and second external terminals to the first and second contact surfaces, respectively.

This device can measure a low impedance of the electronic component accurately.

DESCRIPTION OF THE PREFERRED EMBODIMENT

Exemplary Embodiment 1

Figure 1:
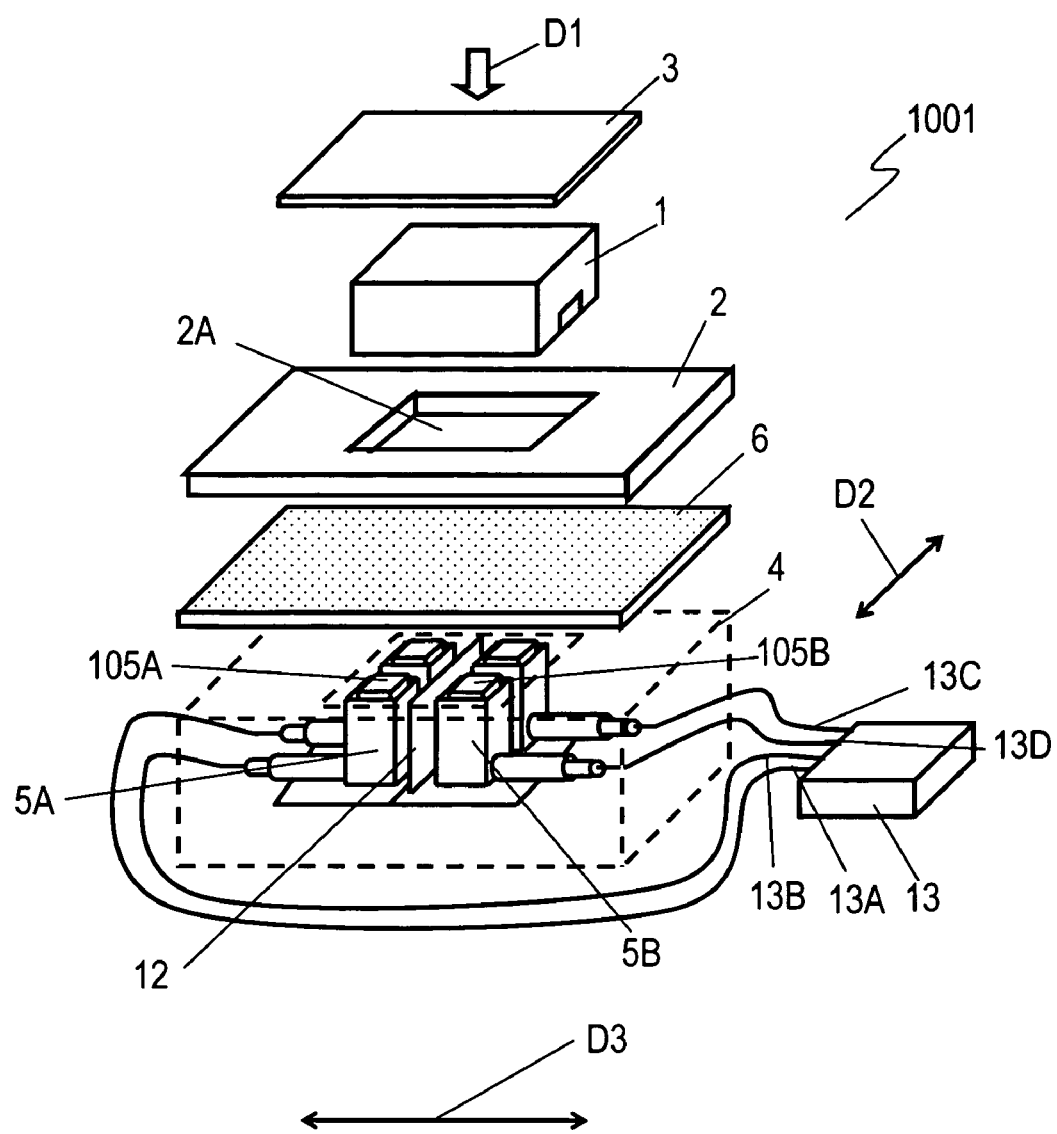
FIG. 1 is an exploded perspective view of a device for measuring an impedance of a surface-mounted electronic component according to Exemplary Embodiment 1 of the present invention.
Figure 2:
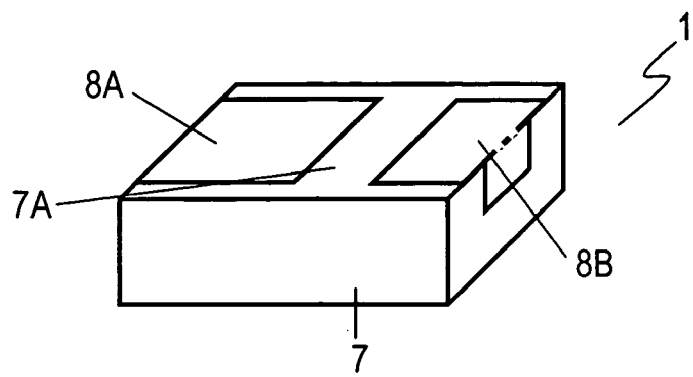
FIG. 2 is a perspective view of the surface-mounted electronic component to be measured by the impedance measuring device according to Embodiment 1.

FIG. 1 is an exploded perspective view of device 1001 for measuring an impedance according to Exemplary Embodiment 1 of the present invention. FIG. 2 is a perspective view of surface-mounted electronic component 1 to be measured by device 1001.

In device 1001, measuring probes 5A and 5B that are electrically connected to impedance measuring apparatus 13 face each other at fixing stand 4 for fixing measuring probes 5A and 5B. Device 1001 includes anisotropic conductive sheet 6 and guard plate 12 provided between measuring probes 5A and 5B. Anisotropic conductive sheet 6 covers respective upper surfaces 105A and 105B of measuring probes 5A and 5B. Measuring probes 5A and 5B are arranged along direction D3. Surface-mounted electronic component 1, an object to be measured, is inserted into through-hole 2A formed in positioning member 2 and is mounted on anisotropic conductive sheet 6. Surface-mounted electronic component 1 includes insulating case 7 made of insulating material, such as resin, and external terminals 8A and 8B exposing from lower surface 7A of insulating case 7. Surface-mounted electronic component 1 is pressed in direction D1 toward measuring probes 5A and 5B with pressing member 3. External terminals 8A and 8B are electrically connected to measuring probes 5A and 5B via anisotropic conductive sheet 6, respectively.

Figure 3:
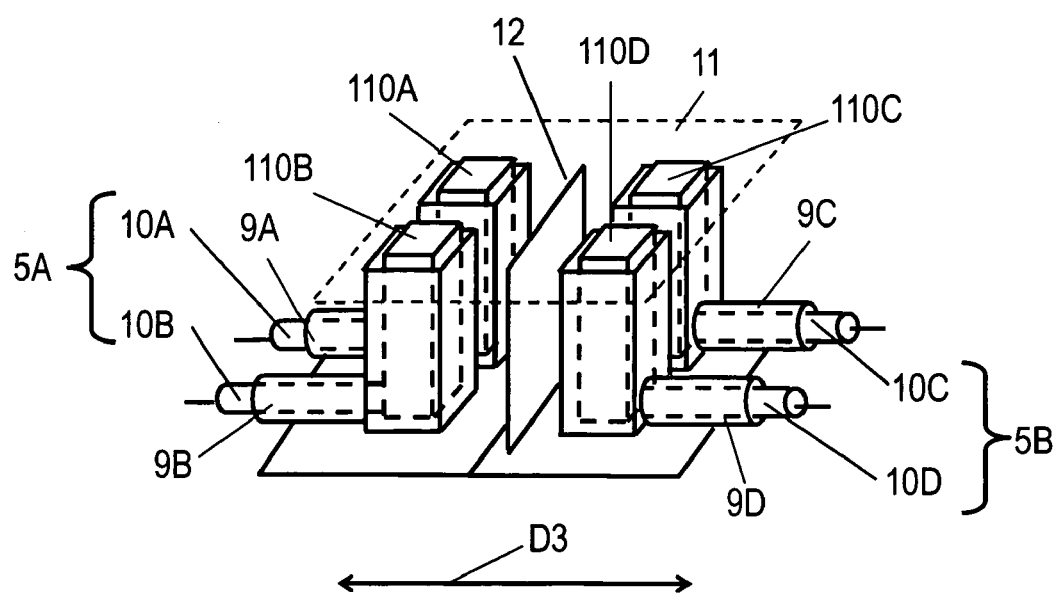
FIG. 3 is a schematic perspective view of a measuring probe of the device according to Embodiment 1.

FIG. 3 is a perspective view of measuring probes 5A and 5B. Measuring probe 5A includes current-measuring probe 10A and voltage-measuring probe 10B separate from each other. Measuring probe 5B includes current-measuring probe 10C and voltage-measuring probe 10D separated from each other. Current-measuring probes 10A and 10C are connected to current-measuring terminals 13A and 13C of impedance measuring apparatus 13, respectively. Voltage-measuring probes 10B and 10D are connected to voltage-measuring terminals 13B and 13D of impedance measuring apparatus 13, respectively. Measuring probes 10A to 10D are surrounded by shields 9A to 9D that have shielding effect against noise, respectively. Shields 9A to 9D are connected to guard plate 12 made of conductive material. Guard plate 12 eliminates stray impedance between measuring probes 5A and 5B. Measuring probes 10A to 10D have contact surfaces 110A to 110D contacting anisotropic conductive sheet 6, respectively. Contact surfaces 110A to 110D expose upward from shields 9A to 9D, respectively, and are flush with each other, that is, are provided in upper surface 11 of fixing stand 4. Shields 9A to 9D are connected to a ground of impedance measuring apparatus 13. Fixing stand 4 connected to the ground of impedance measuring apparatus 13 is made of metal, and suppresses stray impedance.

Figure 4A:
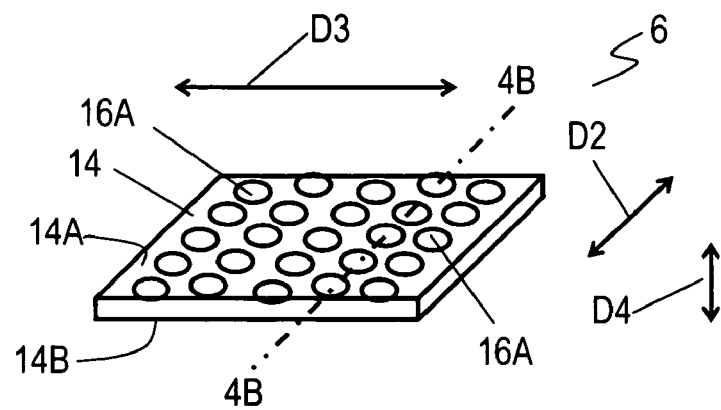
FIG. 4A is a perspective view of an anisotropic conductive sheet of the device according to Embodiment 1.
Figure 4B:
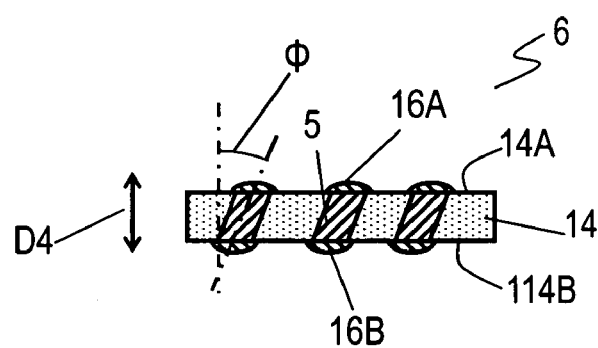
FIG. 4B is a cross-sectional view of the anisotropic conductive sheet shown at line 4B-4B shown in FIG. 4A.
Figure 4C:
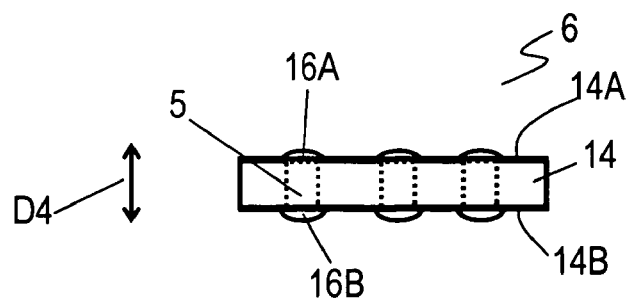
FIG. 4C is a side view of the anisotropic conductive sheet shown in FIG. 4A.

Anisotropic conductive sheet 6 will be described below. FIG. 4A is a perspective view of anisotropic conductive sheet 6. FIG. 4B is a cross-sectional view of anisotropic conductive sheet 6 at line 4B-4B shown in FIG. 4A. FIG. 4C is a side view of anisotropic conductive sheet 6 shown in FIG. 4D seen from direction D2. In FIG. 4A to FIG. 4C, no pressure is applied to anisotropic conductive sheet 6.

As shown in FIG. 4A, anisotropic conductive sheet 6 has elastic sheet 14 having an insulating property. Elastic sheet 14 has upper surface 14A and lower surface 14B opposite to upper surface 14A. Plural contacts 16A protrude from upper surface 14A of elastic sheet 14 while plural contacts 16B protrude from lower surface 14B.

As shown in FIG. 4B, plural conductive wires 15 are provided in elastic sheet 14 that penetrate from upper surface 14A to lower surface 14B. Each of conductive wires 15 is connected to contacts 16A and 16B. Direction D2 is perpendicular to direction D3 along which measuring probes 5A and 5B are arranged. Direction D2 crosses direction D3. Conductive wires 15 extend from upper surface 14A of elastic sheet 14 toward lower surface 14B and incline at angle Φ with respect to thickness direction D4 which directs from upper surface 14 to lower surface 14B of elastic sheet 14. Conductive wires 15 have stiffness.

As shown in FIGS. 4B and 4C, conductive wires 15 extend in thickness direction D4 without inclining in direction D3, and are aligned at constant intervals without inclining to the left and right seen from direction D2 crossing direction D3. Conductive wires 15 incline toward direction D2 crossing direction D3 along which measuring probes 5A and 5B are arranged, and are not perpendicular to upper surface 14A of elastic sheet 14. When anisotropic conductive sheet 6 is pressed in direction D1, elastic sheet 14 elastically deforms more easily in direction D2 than in direction D3. Conductive wires 15 are arranged at the constant intervals and incline in single direction D2, hence providing conductive sheet 6 with uniform elasticity and high conductivity.

Inclining angle Φ of conductive wires 15 ranges preferably from 0° to 45°, and reduces an increase of equivalent series impedance, namely, an equivalent series resistance (ESR) and an equivalent series inductance (ESL), of anisotropic conductive sheet 6.

Elastic sheet 14 is preferably made of silicone rubber. The thickness of elastic sheet 14 ranges preferably from 0.1 mm to 3.0 mm. Elastic sheet having a thickness greater than 3.0 mm causes conductive wires 15 to be long, accordingly causing anisotropic conductive sheet 6 to have a large resistance. Elastic sheet 14 having a thickness smaller than 0.1 mm prevents elastic sheet 14 from deforming elastically according to surface configurations of external terminals 8A and 8B of surface-mounted electronic component 1 and contact surfaces 110A to 110D of measuring probes 10A to 10D.

In order to easily remove dust attached onto anisotropic conductive sheet 6 with an adhesive sheet or air, the surfaces of elastic sheet 14 may be preferably processed with surface treatment, such as fluorine-resin processing.

Conductive wires 15 are made of conductive metal, such as platinum, tungsten, silver, copper, copper alloy, or tin alloy as to reduce connection resistance between contacts 16A and 16B to increase connection strength. Conductive wires 15 may be made preferably of material, such as non-oxidizing metal, having a low resistance. Conductive wires 15 may be made of material plated with tin or bismuth which hardly has an insulating property by oxidation.

The diameter of conductive wire 15 ranges preferably from 30 μm to 500 μm. The diameter of each of conductive wires 15 may be determined appropriately according to the rigidity of the metal of the wires in order to be prevented from breaking or deforming due to repetitive elastic deformation of anisotropic conductive sheet 6. The shapes and the intervals of conductive wires 15 may be determined according to the sizes of external terminals 8A and 8B and to the interval between the terminals.

Contacts 16A and 16B protrude from upper surface 14A and lower surface 14B of elastic sheet 14, respectively, accordingly being connected electrically to measuring probes 5A and 5B and external terminals 8A and 8B, respectively. Contacts 16A and 16B preferably have dome shapes or substantially-hemispherical shapes. These shapes allow contacts 16A and 16B to contact external terminals 8A and 8B and measuring terminals 5A and 5B at certain points on the surfaces of contacts 16A and 16B according to the deformation of elastic sheet 14, thereby securely providing electrical connection.

Each of contacts 16A and 16B preferably has a maximum external widths ranging from 30 μm to 500 μm. The maximum external width smaller than 30 μm may prevent contacts 16A and 16B from being bonded firmly to conductive wires 15. The maximum external width greater than 50 μm may cause contacts 16A adjoining each other to contact each other and may cause contacts 16B adjoining each other to contact each other if conductive wires 15 incline too much, hence preventing elastic sheet 14 from deforming.

Contacts 16A and 16B are preferably made of wear-resistant and low contact resistance conductive material, such as nickel and platinum. Contacts 16A and 16B may be plated with tin or bismuth which hardly has an insulating property due to oxidation. Contacts 16A and 16B may be formed unitarily with conductive wires 15 rather than separated from conductive wires 15.

Positioning member 2 is made of an insulating plate and has through-hole 2A formed therein. Positioning member 2 regulates the position of surface-mounted electronic component 1 as to cause external terminals 8A and 8B to be connected electrically to measuring probes 5A and 5B, respectively. Positioning member 2 prevents surface-mounted electronic component 1 from being displaced upon being pressed with pressing member 3. Through-hole 2A may be a notch.

Figure 5A:
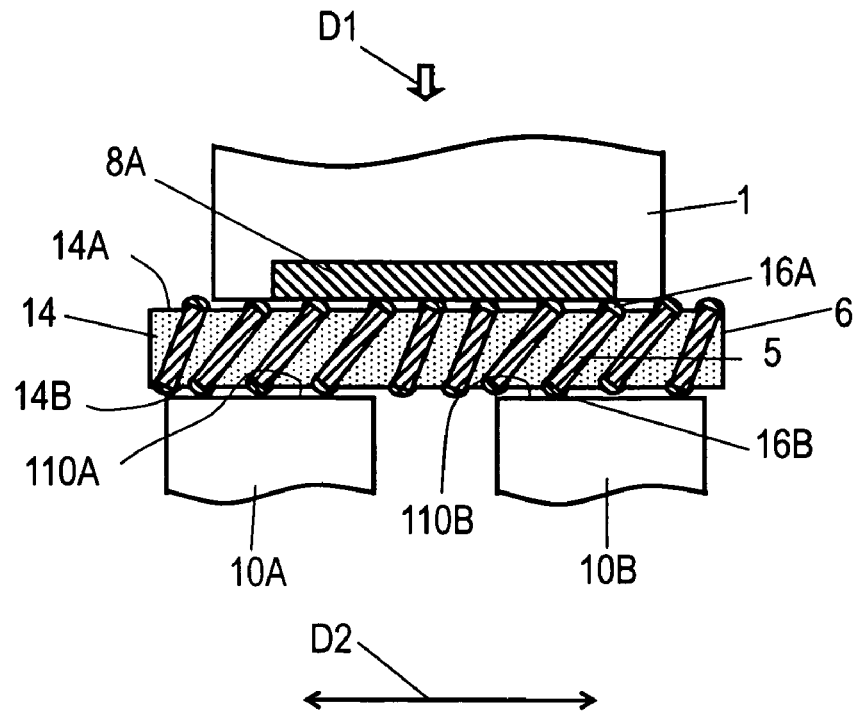
FIG. 5A is a cross-sectional view of an essential part of the device according to Embodiment 1.
Figure 5B:
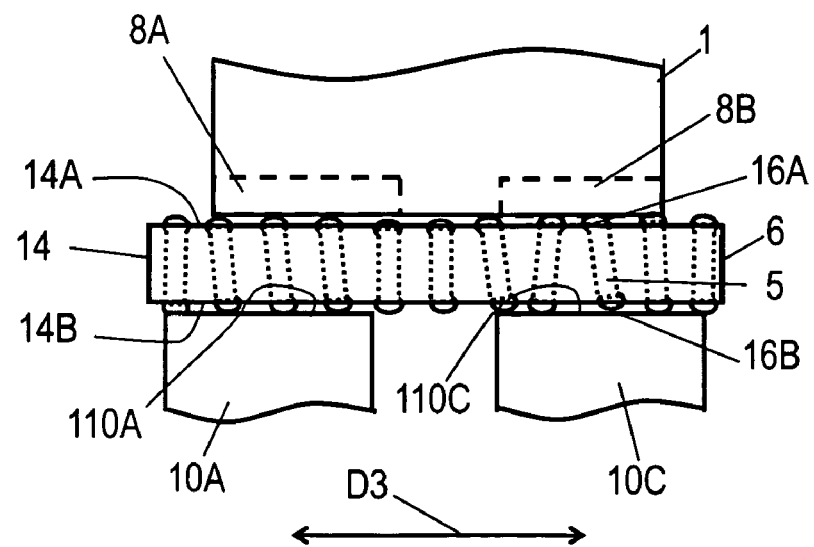
FIG. 5B is a side view of an essential part of the device according to Embodiment 1.

A method of measuring impedance of surface-mounted electronic component 1 with using impedance measuring device 1001 will be described below. FIGS. 5A and 5B are a cross-sectional view and a side view of essential parts of impedance measuring device 1001 during measurement, respectively.

First, surface-mounted electronic component 1 is mounted on anisotropic conductive sheet 6, while being placed in through-hole 2A of positing member 2 provided on anisotropic conductive sheet 6.

Then, as shown in FIGS. 5A and 5B, surface-mounted electronic component 1 is pressed with pressing member 3 in direction D1 with a predetermined pressure. Upon being pressed, anisotropic conductive sheet 6 (elastic sheet 14) deforms elastically to contact external terminals 8A and 8B and contact surfaces 110A to 110D of measuring probes 10A to 10D.

As shown in FIG. 5A, conductive wires 15 incline further in direction D2 crossing direction D3 according to the deformation of anisotropic conductive sheet 6 (elastic sheet 14). As shown in FIG. 5B, the inclining of conductive wires in direction D3 is smaller than the inclining of the wires in direction D2. External terminal 8A is electrically connected to contact surfaces 110A and 110B via conductive wires 15 and contacts 16A and 16B. External terminal 8B is electrically connected to contact surfaces 110C and 110D via conductive wires 15 and contacts 16A and 16B. External terminal 8A is not electrically connected to contact surface 110C or 110D. External terminal 8B is not electrically connected to contact surface 110A or 110B.

Conductive wires 15 penetrating in thickness direction D4 allows anisotropic conductive sheet 6 to have a small loss at high frequencies of anisotropic conductive sheet 6, and accordingly enables the impedance of surface-mounted electronic component 1 to be measured accurately even if the impedance is low.

Conductive wires 15 incline according to the deformation of pressed elastic sheet 14, and thereby, allows external terminals 8A and 8B to be electrically connected stably to measuring probes 10A and 10B even when external terminals 8A and 8B have variations in processing or even when external terminals 8A and 8B incline due to the inclining of surface-mounted electronic component 1.

Measuring probes 5A and 5B are connected to external terminals 8A and 8B, respectively. Conductive wires 15 are inclines more in direction D2 crossing direction D3 than in direction D3, accordingly preventing measuring probe 5A from being connected electrically to external terminal 8B and preventing measuring probe 5B from being connected electrically to external terminal 8A.

A surface-mounted solid electrolytic capacitor as the surface-mounted electronic component 1 has a resonant frequency ranging from 100 kHz to 10 MHz and an impedance of several milli-ohms at the resonant frequency. A balanced-bridge type impedance analyzer as impedance measuring apparatus 13 can measure such a low impedance of the surface-mounted solid electrolytic capacitor accurately.

Exemplary Embodiment 2

Figure 6:
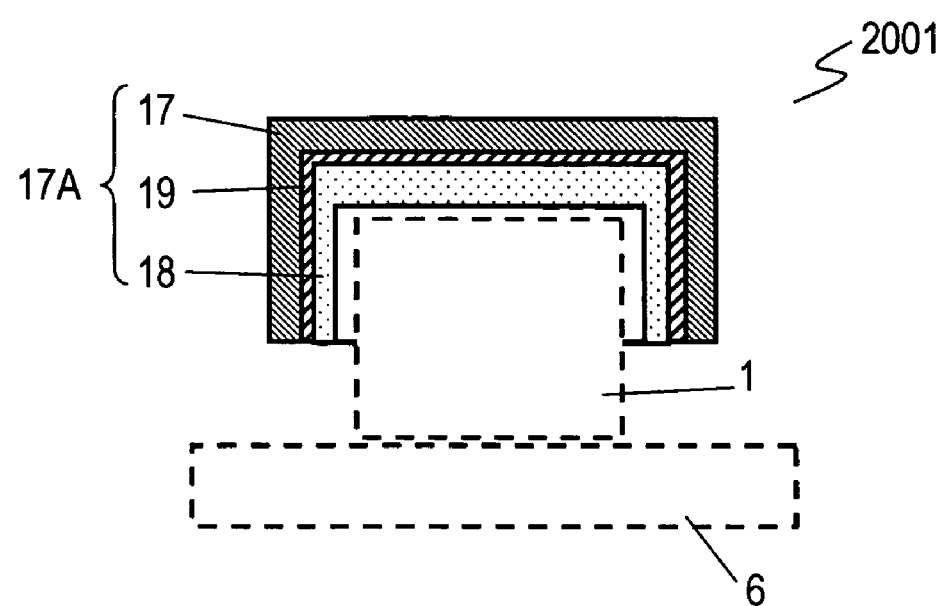
FIG. 6 is a cross-sectional view of an essential part of a device for measuring an impedance according to Exemplary Embodiment 2 of the invention.

FIG. 6 is a cross-sectional view of an essential part of impedance measuring device 2001 according to Exemplary Embodiment 2 of the present invention. In FIG. 6, components similar to those of impedance measuring device 1001 shown in FIG. 1 according to Embodiment 1 are denoted by the same reference numerals, and their description will be omitted. Impedance measuring device 2001 according to Embodiment 2 includes pressing member 17A instead of pressing member 3 of impedance measuring device 1001 shown in FIG. 1 according to Embodiment 1.

FIG. 6 is a cross-sectional view of pressing member 17A along direction D2 crossing direction D3 shown in FIG. 1. Pressing member 17A includes pressing frame 17 made of insulating material. Pressing frame 17 is formed to have a recess formed therein. The upper portion of surface-mounted electronic component 1 is arranged to be inserted into the recess. Pressing frame 17 having the recess prevents surface-mounted electronic component 1 from being displaced when pressing the component. Further, a load pressure is produced in a direction crossing direction D3 from a side or an edge of an upper surface of surface-mounted electronic component 1. This load pressure causes a pressure applied to anisotropic conductive sheet 6 in direction D2 crossing direction D3, and accordingly, causes conductive wires 15 to incline reliably in direction D2, thus enabling a low impedance of surface-mounted electronic component 1 to be measure accurately.

Pressing member 17A includes shield member 19 made of conductive material, such as metal mesh, provided on its inner surface opposite to surface-mounted electronic component 1. Pressing member 17A further includes elastic insulating member 18 provided on the inner surface of shield member 19.

Shield member 19 surrounds surface-mounted electronic component 1 as to reduce noises existing around surface-mounted electronic component 1, and accordingly, improves accuracy of the impedance measurement. Shield member 19 is connected to a ground of impedance measuring apparatus 13, thereby eliminating stray impedance.

Elastic insulating member 18 allows pressing member 17A to uniformly press surface-mounted electronic component 1 from above.

Pressing frame 17 may be made of conductive material. In this case, pressing frame 17 functions as a shield member to be connected to the ground of impedance measuring apparatus 13.

What is claimed is:

1. A device for measuring an impedance of an electronic component with using an impedance measuring apparatus, wherein the electronic component includes an insulating case, a first external terminal, and a second external terminal, the insulating case having a surface, the first external terminal and the second external terminal exposing on the surface of the insulating case, and wherein the impedance measuring apparatus includes a first measuring terminal and a second measuring terminal, said impedance measuring device comprising:
   a first probe having a first contact surface and arranged to be connected to the first measuring terminal of the impedance measuring apparatus;
   a second probe having a second contact surface and arranged to be connected to the second measuring terminal of the impedance measuring apparatus, the second contact surface being flush with the first contact surface of the first probe;
   an anisotropic conductive sheet having a first surface and a second surface opposite to the first surface, the first surface contacting the first contact surface and the second contact surface; and
   a pressing member for causing the first external terminal and the second external terminal of the electronic component to contact the second surface of the anisotropic conductive sheet, and for pressing the electronic component toward the first contact surface and the second contact surface,
   wherein the anisotropic conductive sheet includes
      an insulating elastic sheet, and
      a plurality of conductive wires penetrating the elastic sheet to expose from the first surface and the second surface, the plurality of conductive wires electrically connecting the first external terminal of the electronic component to the first contact surface, the plurality of conductive wires electrically connecting the second external terminal of the electronic component to the second contact surface of the electronic component;

wherein the plurality of conductive wires incline according to deformation of the elastic sheet;

wherein the first probe and the second probe are arranged in a first direction;

wherein the plurality of conductive wires incline in a second direction crossing the first direction; and wherein the plurality of conductive wires incline more in the first direction than in the second direction.

2. The device of claim 1, wherein the pressing member includes a pressing frame having a recess formed therein, the electronic component being arranged to be inserted in the recess.

3. The device of claim 1, wherein the pressing member includes a shield member arranged to surround the electronic component.

4. The device of claim 1, wherein the plurality of conductive wires do not incline in the first direction.

5. The device of claim 1, wherein the impedance measuring apparatus comprises a balanced-bridge type impedance analyzer.

6. The device of claim 1, wherein the anisotropic conductive sheet further includes a plurality of contacts protruding from the first surface of the elastic sheet, the plurality of contacts being connected to the plurality of conductive wires, respectively.

7. The device of claim 1, wherein the anisotropic conductive sheet further includes a plurality of contacts protruding from the second surface of the elastic sheet, the plurality of contacts being connected to the plurality of conductive wires, respectively.

* * * * *